United States Patent
Leffel et al.

(10) Patent No.: US 6,885,242 B2
(45) Date of Patent: Apr. 26, 2005

(54) FEEDFORWARD LINEAR AMPLIFIER

(75) Inventors: Michael D. Leffel, Crystal Lake, IL (US); Edward V. Louis, St. Charles, IL (US)

(73) Assignee: Motorola, Inc., Schaumburg, IL (US)

( * ) Notice: Subject to any disclaimer, the term of this patent is extended or adjusted under 35 U.S.C. 154(b) by 44 days.

(21) Appl. No.: 10/610,284

(22) Filed: Jun. 30, 2003

(65) Prior Publication Data

US 2004/0263249 A1 Dec. 30, 2004

(51) Int. Cl.[7] ................................................ H03F 1/26
(52) U.S. Cl. ..................................... 330/149; 330/151
(58) Field of Search .......................... 330/52, 149, 151

(56) References Cited

U.S. PATENT DOCUMENTS 4,980,652 A   12/1990  Tarusawa et al.
5,929,704 A * 7/1999  Proctor et al. .............. 330/149
6,429,738 B1 * 8/2002  Kenington ................... 330/52

* cited by examiner

Primary Examiner—Steven J. Mottola
(74) Attorney, Agent, or Firm—Steven A. May (57) ABSTRACT

A control circuit for a feed forward amplifier provides for pausing control and continuous adjustment of a control signal, provides for the control signal to start at any point, provides for rapid convergence, and that does not perturb the system up or down one step to confirm the convergence of the system. The control circuit receives a sampled version of a feed forward amplifier output signal, generates a non-offset control signal based on the sampled output signal, separately generates an offset voltage by reference to voltages stored in a table or based on the non-offset control signal, and combines the non-offset control signal with the offset voltage to produce a control signal. The feed forward amplifier may then adjust an error signal based on the control signal to produce an adjusted error signal that is capable of reducing distortion in the feed forward amplifier.

20 Claims, 6 Drawing Sheets

FEEDFORWARD LINEAR AMPLIFIER

FIELD OF THE INVENTION

The present invention relates generally to wireless communication devices, and in particular to a feed forward linear amplifier portion of a wireless communication device.

BACKGROUND OF THE INVENTION

The frequency spectrum that is shared among radio communication devices is limited. Thus the ability of a transmitter to transmit as much information as possible in an allocated frequency spectrum or channel without interfering with other communication devices in adjacent channels is of great importance. To transmit as much information as possible in the allocated channel, digital communication systems typically modulate both the amplitude and phase of a radio frequency (RF) carrier. The amplitude modulation allows more information to be encoded on the carrier in a given channel than if only the phase was modulated. However, the amplitude modulation puts additional requirements on the transmitter that would not exist if only the phase of the RF carrier was modulated.

These additional requirements are due to the inherent nonlinear effects resulting from the amplification of an amplitude-modulated signal by an RF power amplifier. Due to the nonlinear characteristics of the RF power amplifier, signal distortion components that include an amplitude component and a phase component are added to the original signal. A number of prior art signal processing techniques have been developed to compensate for the nonlinear characteristics of RF power amplifiers. One such technique involves the use of a feed forward correction circuit in a feed forward amplifier. In general, feed forward amplifiers separate out distortion components generated by the RF power amplifier to create an error signal. The error signal is then amplified and added to the RF power amplifier's output with an amplitude, phase, and delay adjusted for maximum cancellation of the distortion components.

Figure 1:
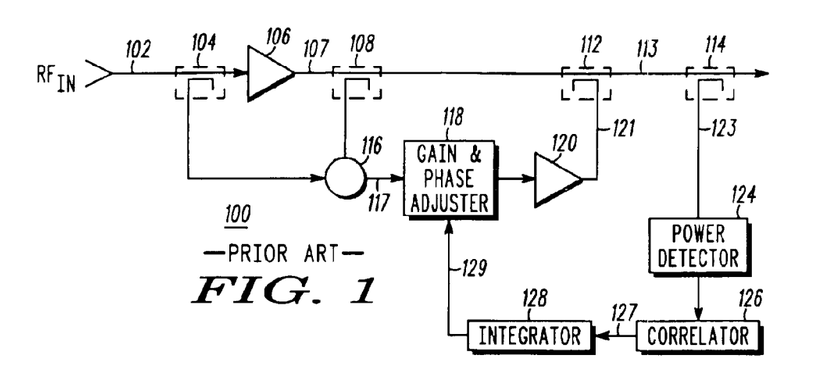
FIG. 1 is a block diagram of an exemplary feed forward amplifier of the prior art.

FIG. 1 is a block diagram of an exemplary feed forward amplifier 100 of the prior art. In feed forward amplifier 100, an input signal 102 having carrier components is routed to a radio frequency (RF) power amplifier 106 via an input signal coupler 104. RF power amplifier 106 amplifies the signal to produce an amplified signal 107. As mentioned above, RF power amplifier 106 introduces distortion components to the amplified signal, which distortion components are partially cancelled by an error signal output by a feed forward correction circuit.

The feed forward correction circuit includes a summation junction 116, a gain and phase adjuster 118, and an error amplifier 120. Summation junction 116 receives a portion of input signal 102 via input signal coupler 104 and further receives a portion of amplified signal 107 via a first output signal coupler 108 coupled to an output of RF power amplifier 106. Summation junction 116 subtracts the received portion of the amplified signal from the received portion of the input signal to produce an error signal 117. The subtraction results in a partial cancellation of the carrier components of the received portion of amplified signal by the carrier components of the received portion of the input signal. As a result, error signal 117 primarily contains the distortion components of the received portion of the amplified signal.

Summation junction 116 conveys error signal 117 to error amplifier 120 via a feed forward gain and phase adjuster 118. Gain and phase adjuster 118 adjusts a gain and/or phase of error signal 117 based on a control signal 129 in order to facilitate a cancellation of the distortion components of amplified signal 107 by an amplified and gain and/or phase adjusted version of error signal 117. Gain and phase adjuster 118 then conveys the gain and/or phase adjusted error signal to error amplifier 120. Error amplifier 120 amplifies the received error signal to produce an amplified error signal 121 and conveys the amplified error signal to an output signal combiner 112. Output signal combiner 112 combines amplified error signal 121 with amplified signal 107 to partially cancel the distortion components of the amplified signal and produce a distortion reduced output signal 113.

Control signal 129 is generated by a control circuit comprising a power detector 124, a correlator 126, and an integrator 128. A second output signal coupler 114 samples output signal 113 to produce an attenuated output signal 123. Second output signal coupler 114 conveys attenuated output signal 123 to detector 124. Detector 124 detects a power of attenuated output signal 123 to produce a detected signal 125 that the detector conveys to correlator 126. Correlator 126 correlates detected signal 125 to a known reference signal to produce a correlation signal 127 that the correlator conveys to integrator 128. Integrator 128 integrates correlation signal 127 to produce control signal 129. Control signal 129 is then used by gain and phase adjuster 118 to adjust the gain and/or phase of error signal 117, thereby adjusting the error signal based on distortion components detected in output signal 113.

In a code division multiple access (CDMA) communication system, the bandwidth of integrator 128 must be very narrow in order to filter an audio pilot tone from a noise-like CDMA signal. The narrow bandwidth of the integrator limits the slew rate of correlator 126 such that the time that it takes control signal 129 to converge from a "rail," or initial, position to an optimal (near midrange) position when amplifier 100 is turned on or keyed up may be as long as 30 seconds. Furthermore, the control circuit of feed forward amplifier 100 is not capable of pausing, that is, of holding a control signal at a determined level, while the feed forward amplifier discontinues operation in the event that a performance of the feed forward amplifier is outside of an acceptable range.

Figure 2:
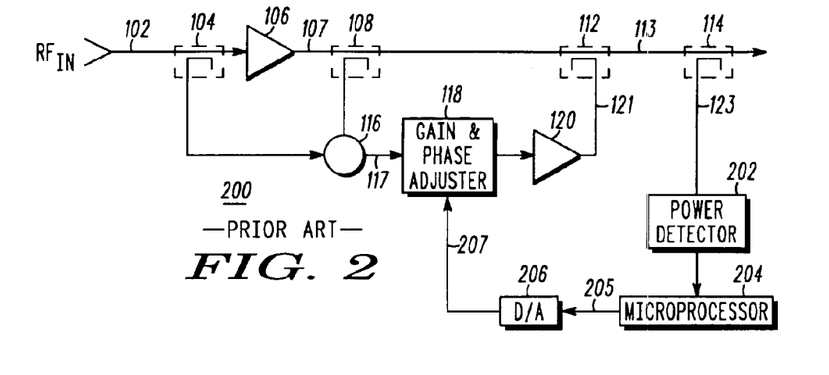
FIG. 2 is a block diagram of another exemplary feed forward amplifier of the prior art.

FIG. 2 is a block diagram of another exemplary feed forward amplifier 200 of the prior art. Feed forward amplifier 200 operates in a manner similar to the operation of feed forward amplifier 100 except that feed forward amplifier 200 digitally generates a control signal 207. That is, in feed forward amplifier 200, an attenuated output signal 123 is conveyed to a detector 202 that detects a power of attenuated output signal 123 and produces a first digital signal 203 corresponding to the detected signal. Detector 202 conveys detected signal 203 to a microprocessor 204 that correlates the detected signal to a known reference value to produce a second digital signal 205 corresponding to the correlation. Microprocessor 204 then conveys digital signal 205 to a digital-to-analog converter (D/A) 206 that converts digital signal 205 to an analog signal to produce control signal 207. Control signal 207 is then used by gain and phase adjuster 118 to adjust the gain and/or phase of error signal 117.

Unlike feed forward amplifier 100, feed forward amplifier 200 is capable of pausing, that is, of holding a control signal at a determined level, while the feed forward amplifier discontinues operation in the event that a performance of the feed forward amplifier is outside of an acceptable range. Furthermore, unlike feed forward amplifier 100, feed forward amplifier 200 provides a control signal 207 that can start at any point, eliminating the need to converge from a "rail" position. However, the adjustments provided by feed forward amplifier 200 are limited to discrete step sizes and are further limited by a time delay between adjustments, unlike the continuous and nearly instantaneous adjustments of feed forward amplifier 100. Furthermore, D/A 206 limits the error correction provided by the feed forward correction circuit and control circuit of feed forward amplifier 200. In addition, once converged, the control circuit must perturb the system up or down (+/−) one step to confirm the level at which feed forward amplifier 200 has converged.

Therefore a need exists for a method and an apparatus in feed forward amplifier that provides for pausing control and continuous adjustment of a control signal, provides for the control signal to start at any point, provides for rapid convergence, and that does not perturb the system up or down one step to confirm the convergence of the system.

DESCRIPTION OF A PREFERRED EMBODIMENT

To address the need for a method and apparatus in feed forward amplifier that provides for pausing control and continuous adjustment of a control signal, provides for the control signal to start at any point, provides for rapid convergence, and that does not perturb the system up or down one step to confirm the convergence of the system, a control circuit for a feed forward amplifier is provided that receives a sampled version of an output signal of the feed forward amplifier, generates a non-offset control signal based on the sampled output signal, separately generates an offset voltage by reference to voltages stored in a table or based on the non-offset control signal, and combines the non-offset control signal with the offset voltage to produce a control signal. The feed forward amplifier may then adjust an error signal based on the control signal to produce an adjusted error signal that is capable of reducing distortion in the feed forward amplifier.

Generally, the present invention encompasses a method for correcting distortion in a feed forward amplifier. The method includes determining an error signal based on an input signal and an amplified version of the input signal, sampling an output signal to produce an attenuated output signal, generating a non-offset control signal based on the attenuated output signal, and generating an offset voltage. The method further includes combining the non-offset control signal with the offset voltage to produce a control signal and adjusting the error signal based on the control signal to produce an adjusted error signal that is capable of reducing distortion in the feed forward amplifier.

Another embodiment of the present invention encompasses an apparatus for correcting distortion in a feed forward amplifier. The apparatus includes a control circuit that receives an attenuated version of an output signal, generates a non-offset control signal based on the attenuated output signal, generates an offset voltage, combines the non-offset control signal with the offset voltage to produce a control signal, and wherein the control signal is capable of causing an adjustment of an error signal to produce an adjusted error signal that is capable of reducing distortion in the feed forward amplifier.

Yet another embodiment of the present invention provides a communication device having a transmitter that includes a main signal path, a feed forward correction circuit coupled to the main signal path, and a control circuit coupled to main signal path and to the feed forward correction circuit. The main signal path receives an input signal, amplifies the input signal to produce an amplified signal, and produces an output signal based on the amplified signal and an adjusted error signal. The feed forward correction circuit produces an error signal based on the input signal and the amplified signal. The control circuit receives a sampled version of the output signal, generates a non-offset control signal based on the sampled version of the output signal, and combines the non-offset control signal with an offset voltage to produce a control signal. The feed forward correction circuit further adjusts the error signal based on the control signal to produce the adjusted error signal.

Figure 3:
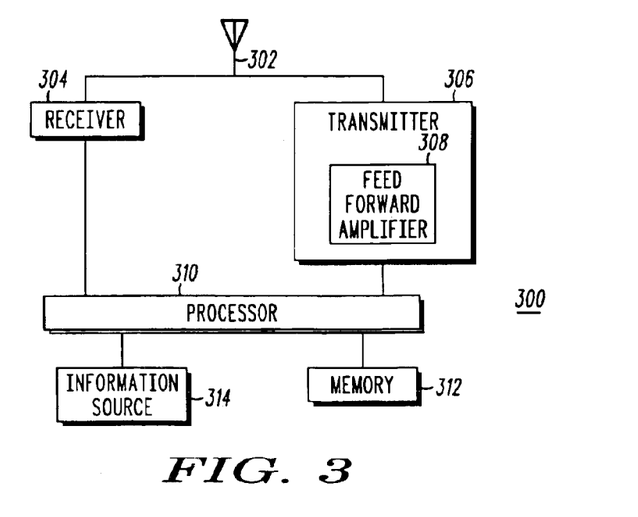
FIG. 3 is a block diagram of a communication device in accordance with an embodiment of the present invention.

The present invention may be more fully described with reference to FIGS. 3–7B. FIG. 3 is a block diagram of a communication device 300 in accordance with an embodiment of the present invention. Preferably, communication device 300 is a base transceiver station; however, alternatively communication device 300 may be any wireless communication device capable of wirelessly transmitting information, such as a cellular telephone, a radiotelephone, or a wireless modem. Communication device 300 includes an antenna 302 coupled to each of a receiver 304 and a transmitter 306 having a feed forward amplifier 308. Communication device 300 further includes a processor 310, such as one or more microprocessors, microcontrollers, digital signal processors (DSPs), combinations thereof or such other devices known to those having ordinary skill in the art, coupled to each of receiver 304 and transmitter 306 and further coupled to a memory device 312 and an information source 314. Memory device 312, such as random access memory (RAM), dynamic random access memory (DRAM), and/or read only memory (ROM) or equivalents thereof, stores data and programs that may be executed by executed by processor 310 in the operation of communication device 300. Information source 314 may comprise an interface for devices or networks external to communication device 300, or alternatively, in the case of a cellular telephone or a radiotelephone, may be a user interface, or in another alternative embodiment may be included in processor 310 and may be an application running on the processor.

Information source 314 or receiver 304 sources information to processor 310. Processor 310 processes the information in accordance with well-known signal processing techniques and then conveys a signal comprising the processed information to transmitter 306. Transmitter 306 modulates the information onto a radio frequency (RF) carrier to produce an RF signal and routes the RF signal to feed forward amplifier 308, which amplifies the signal for transmission via antenna 302.

Figure 4:
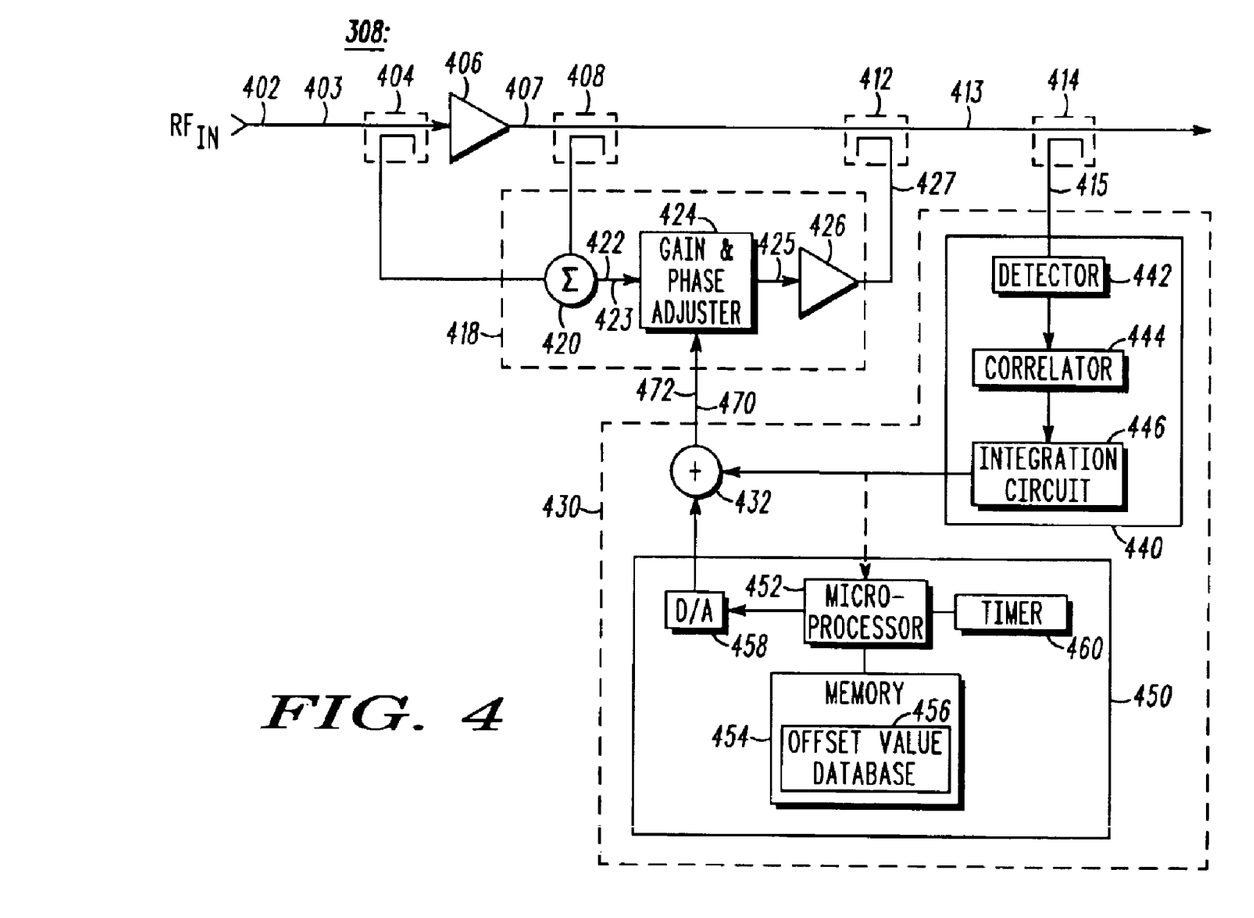
FIG. 4 is a block diagram of the feed forward amplifier of FIG. 3 in accordance with an embodiment of the present invention.
Figure 5:
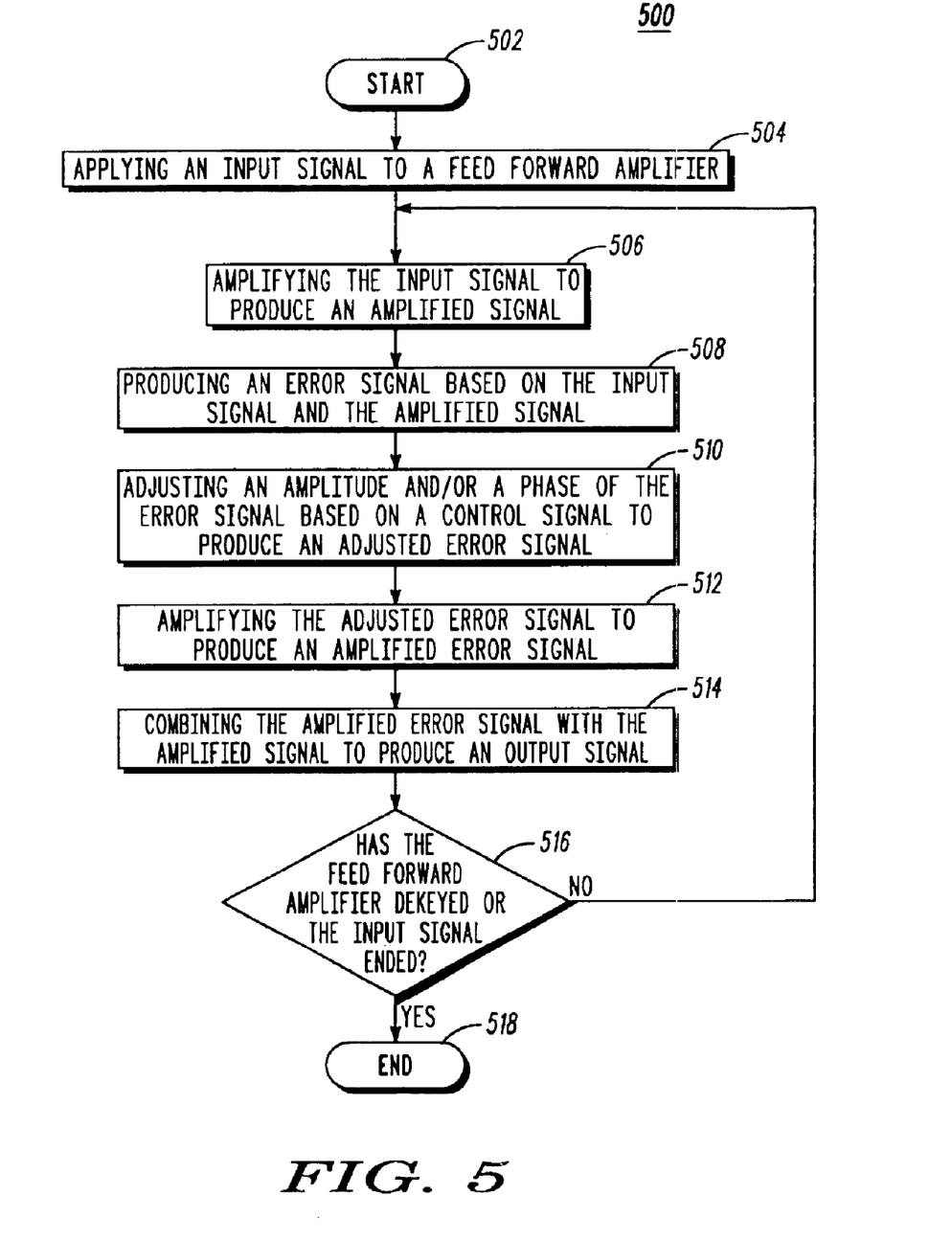
FIG. 5 is a logic flow diagram of steps executed by a feed forward amplifier of FIG. 4 in generating a distortion reduced output signal in accordance with an embodiment of the present invention.

Referring now to FIGS. 4 and 5, an operation of feed forward amplifier 308 is illustrated in accordance with an embodiment of the present invention. FIG. 4 is a block diagram of feed forward amplifier 308 in accordance with an embodiment of the present invention. As depicted by FIG. 4, feed forward amplifier 308 includes a main signal path (404, 406, 408, 412, 414) that is coupled to each of a feed forward correction circuit 418 and a control circuit 430. FIG. 5 is a logic flow diagram 500 of steps executed by feed forward amplifier 308 in generating a distortion reduced output signal in accordance with an embodiment of the present invention. Logic flow diagram 500 begins (502) when an RF signal 402 comprising carrier components is applied (504) to the feed forward amplifier. Feed forward amplifier 308 routes input signal 402 to the main signal path, where the input signal is routed to a radio frequency (RF) power amplifier 406 via an input signal coupler 404, preferably a directional coupler. RF power amplifier 406 includes an RF amplifying element such as a power transistor, input and output matching networks, and biasing and decoupling circuitry as are necessary to allow the functionality of the RF amplifying element and to provide an appropriate bias to the RF amplifying element.

RF power amplifier 406 amplifies (506) the input signal to produce an amplified signal 407 that includes amplified carrier components and further includes distortion components introduced into the amplified signal by the power amplifier. The distortion components are due to the amplitude compression characteristics and the phase distortion characteristics of RF power amplifier 406 when the power amplifier is driven over a range of amplitudes, and if not compensated may cause spreading of the spectrum into the adjacent channels and thus interfere with communication devices using adjacent channels. RF power amplifier 406 then conveys amplified signal 407 to an output signal combiner 412 via a first output signal coupler 408.

In order to cancel the distortion components of amplified signal 407, feed forward correction circuit 418 produces (508) an error signal 422 based on input signal 402 and amplified signal 407. In particular, input signal coupler 404 samples input signal 402 to produce an attenuated input signal and conveys the attenuated input signal to a feed forward correction circuit summation junction 420 included in feed forward correction circuit 418. Signal coupler 408, preferably a directional coupler, samples amplified signal 407 to produce an attenuated amplified signal and conveys the attenuated amplified signal to summation junction 420. Summation junction 420 combines each of the attenuated amplified signal and the attenuated input signal, preferably subtracting the attenuated amplified signal from the attenuated input signal, to produce error signal 422. The subtraction of the attenuated amplified signal from the attenuated input signal results in a partial cancellation of the carrier components of the attenuated amplified signal by the carrier components of the attenuated input signal. As a result, error signal 422 primarily contains the distortion components of the attenuated amplified signal, which correspond to the distortion components of amplified signal 407.

Summation junction 420 conveys error signal 422 to an error amplifier 426 included in feed forward correction circuit 418 via a gain and phase adjuster 424 that is also included in the feed forward correction circuit. In response to a control signal 470 received from control circuit 430, gain and phase adjuster 424 adjusts (510) an amplitude and/or a phase of error signal 422 to produce an amplitude and/or phase adjusted error signal 425. The amplitude and phase adjustments of error signal 422 are designed to facilitate maximum cancellation of the distortion components of amplified signal 407 at an output signal combiner 412. Gain and phase adjuster 424 conveys adjusted error signal 425 to error amplifier 426, and the error amplifier amplifies (512) the adjusted error signal to produce an amplified error signal 427. Amplified error signal 427 includes an error component corresponding to an amplified version of error signal 422 and may further include error signal distortion components that are introduced to the amplified error signal due to non-linear characteristics of the error amplifier.

Error amplifier 426 then conveys amplified error signal 427 to output signal combiner 412, preferably a directional coupler. Output signal combiner 412 combines (514) amplified error signal 427 and amplified signal 407, preferably subtracting the former from the latter, to cancel the distortion components of amplified signal 407 and to produce a distortion reduced output signal 413.

Since input signal 402 typically is an analog signal that is continuously applied to feed forward amplifier 308 and amplified by RF power amplifier 406, and correspondingly error signal 422 is an error signal that is continuously produced, adjusted, and amplified by feed forward correction circuit 418, steps 506 through 514 comprise a loop that is continuously executed by feed forward amplifier 308 until the feed forward amplifier is dekeyed, or powered down, or the input signal ends (516). Logic flow 500 then ends (518).

Control circuit 430 comprises a non-offset control signal generator 440 and an offset voltage generator 450 that are each coupled to an adder 432. Non-offset control signal generator 440 generates an analog, non-offset control signal based on output signal 413 for use in adjusting error signal 422 by gain and phase adjuster 424. Preferably, non-offset control signal generator 440 comprises a detector 442, a correlator 444 coupled to the detector, and an integration circuit 446 coupled to the correlator. Offset voltage generator 450 generates a discrete offset voltage that serves to offset the non-offset control signal generated by non-offset control signal generator 440. Preferably, offset voltage generator 450 includes a microprocessor 452 coupled to a digital-to-analog converter (D/A) 458. However, those who are of ordinary skill in the art realize that there are numerous ways to implement a non-offset control signal generator that generates an analog, non-offset control signal based on an output signal and further to implement an offset voltage generator that generates an offset voltage for a control signal, which implementations may be used herein without departing from the spirit and scope of the present invention.

Figure 6:
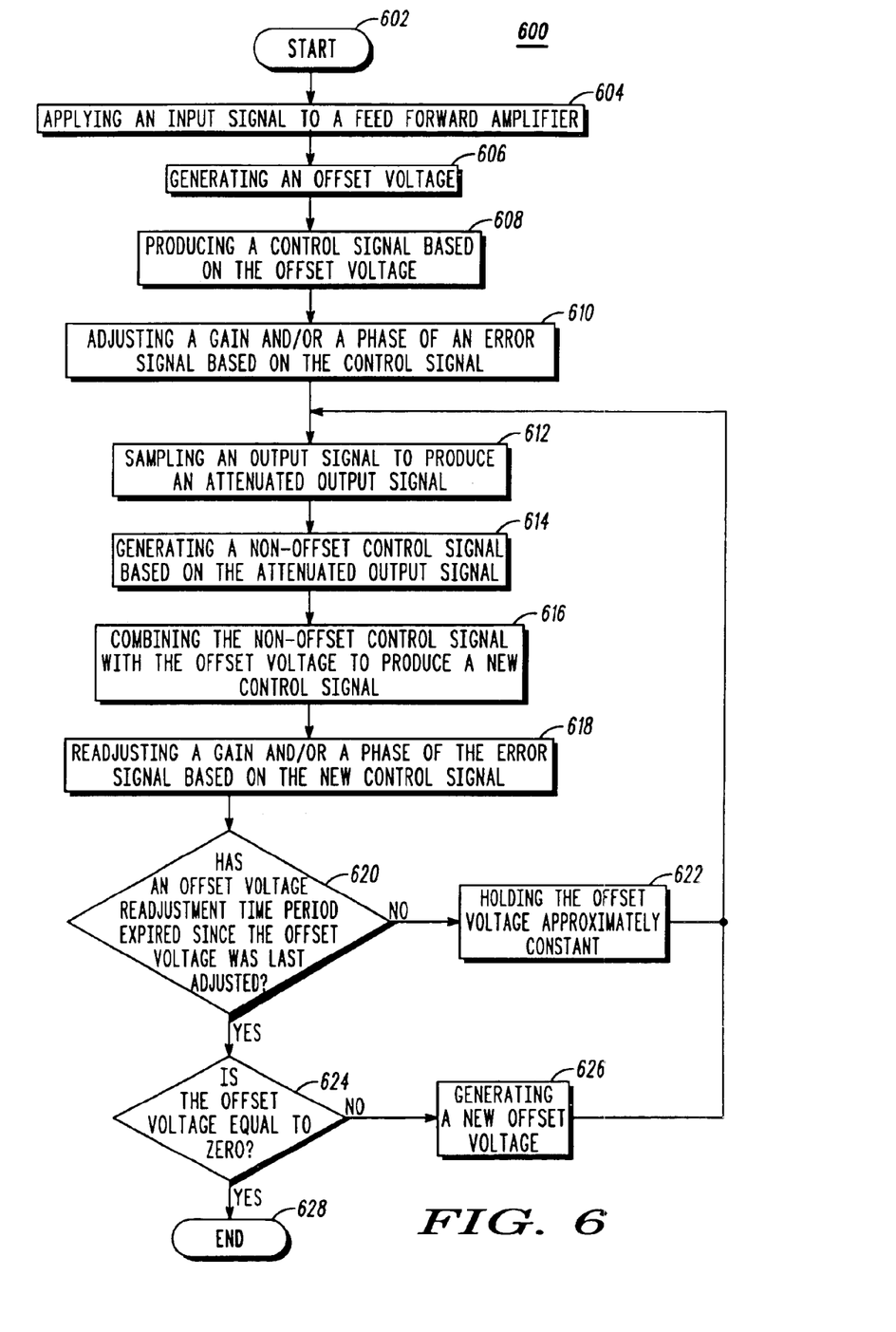
FIG. 6 is a logic flow diagram of steps executed by the feed forward amplifier of FIG. 4 in generating a control signal and adjusting an error signal in accordance with an embodiment of the present invention.

FIG. 6 depicts a logic flow diagram 600 of steps executed by feed forward amplifier 308 in generating a control signal, such as control signal 470, and adjusting an error signal, such as error signal 422, in accordance with an embodiment of the present invention. Logic flow 600 begins (602) when input signal 402 is applied (604) to feed forward amplifier 308. Offset voltage generator 450 generates (606) an initial, or first, offset voltage that the offset voltage generator sources to adder 432. Adder 432 produces (608) an initial, or first, control signal 470 based on the initial offset voltage and conveys the initial control signal to gain and phase adjuster 424. Gain and phase adjuster 424 then adjusts (610) error signal 422 based on the initial control signal 470.

Preferably, offset voltage generator 450 generates offset voltages based on offset values determined by microprocessor 452. Preferably the initial offset voltage is such that control signal 470 starts just below a best, or optimal voltage, allowing integration circuit 440 to produce a non-offset control signal with a voltage level near zero. After each expiration of a subsequent time period, the offset voltage produced by offset voltage generator 450 may be reduced a small amount, forcing the integration circuit 446 to re-converge at a slightly higher value, that is, forcing the integration circuit to produce a non-offset control signal of a slightly higher voltage. Since each new convergence voltage of integration circuit 446 is only slightly higher that the preceding voltage, the convergence is quick and the amplified and adjusted error signal generated by feed forward correction circuit 418 is kept small.

In one embodiment of the present invention, microprocessor 452 determines offset values by retrieving the values from memory 454, which memory maintains a database 456 or table of offset values. In another embodiment of the present invention, memory 454 may maintain to a fixed voltage waveform pattern that is stored as an algorithm. Microprocessor 452 then determines the offset values by executing the algorithm. Microprocessor 452 then conveys the offset value to D/A 458. D/A 458 converts the offset value to an offset voltage and conveys the offset voltage to adder 432.

In another embodiment of the present invention, a closed loop feedback embodiment wherein microprocessor 452 may be coupled to integration circuit 446, the offset voltages may be generated by offset voltage generator 450 based on a fed back version of output signal 413. In the closed loop feedback embodiment, a non-offset control signal generated by non-offset control signal generator 440 is coupled to offset voltage generator 440. Based on the non-offset control signal, microprocessor 452 determines an offset value by reference to database 456 or to the fixed voltage waveform pattern algorithm stored in memory 454. Microprocessor 452 then conveys the offset value to D/A 458 and the D/A converts the offset value to an offset voltage and conveys the offset voltage to adder 432. By utilizing closed loop feedback, offset voltage generator 450 is able to dynamically adjust the offset voltage supplied to adder 432 based on the output signal produced by feed forward amplifier 308.

Control signal 470 may then be modified based on output signal 413. A second output signal coupler 414, preferably a directional coupler, receives output signal 413 and samples (612) the output signal to produce an attenuated output signal. Signal coupler 414 conveys the attenuated output signal to control circuit 430, and in particular to non-offset control signal generator 440. Based on the attenuated output signal, non-offset control signal generator 440 generates (614) a non-offset, or unadjusted, control signal that the non-offset control signal generator sources to adder 432.

Non-offset control signal generator 440 generates the non-offset control signal as follows. Upon receiving an attenuated output signal from signal coupler 414, non-offset control signal generator 440 routes the attenuated output signal to detector 442. Detector 442 detects an energy of the first attenuated output signal to produce a detected signal that the detector coveys to correlator 444. For example, detector 442 may include a power detector that detects a power level of the first attenuated output signal. Examples of power detectors include an average, or RMS, power detector, a peak power detector, a log power detector such as an AD8313 logarithmic detector, available from Analog Devices, Inc., and associated circuitry that is necessary to allow the functionality of the log detector, or a hybrid of two or more of the average power, peak power, and log power detectors. Correlator 444 correlates the detected signal to a known reference signal to produce a correlation signal that the correlator conveys to integration circuit 446. Integration circuit 446 integrates the correlation signal to produce a non-offset, or unadjusted, control signal. Integration circuit 446 then conveys the non-offset control signal to adder 432.

Adder 432, preferably an operational amplifier (op amp), combines (616), preferably sums, the non-offset, or unadjusted, control signal with the offset voltage sourced to the adder by offset voltage generator 450 to produce a second control signal, that is, an offset, or adjusted, version of the non-offset control signal sourced by non-offset control signal generator 440. The second control signal is then conveyed by adder 432 to gain and phase adjuster 424, and gain and phase adjuster 424 adjusts (618) a gain and/or phase of error signal 422 based on the second control signal, thereby adjusting the error signal based on distortion components detected in output signal 413 and reducing an energy of the distortion components of output signal 321.

The offset voltages generated by offset voltage generator 450 are discrete voltages that permit a stepped adjustment of the control signal 470 sourced by control circuit 430 to gain and phase adjuster 424. The non-offset control signals produced by non-offset control signal generator 440 are analog control signals that permit a continuous fine-tuning of the control signal 470 sourced by control circuit 430 to gain and phase adjuster 424. By providing an initial control signal that is based on an initial offset voltage and is set at a target voltage level, and then reducing the offset voltage as the non-offset control signals increase in amplitude, the control signal 470 sourced by control circuit 430 to gain and phase adjuster 424 can quickly converge to the target voltage level and then approximately sustain the target voltage while the non-offset control signal generator, and in particular integration circuit 446, gradually ramps up the amplitude of the non-offset control signal.

Preferably, the offset voltage sourced by offset voltage generator 450 is adjusted, or stepped, each time an offset voltage readjustment time period expires (620) since the offset voltage was last adjusted. Preferably, one or more offset voltage readjustment time periods are maintained in memory 454. Microprocessor 452 then determines each offset voltage readjustment time period with reference to the memory and to a timer 460 coupled to the microprocessor. The initial offset voltage is designed to make the target voltage of the non-offset control signal generator 440, and in particular integration circuit 446, close to zero upon the powering up of feed forward amplifier 338. The offset voltage time periods, and the subsequently determined offset voltages, are then designed to slowly increase the target voltage of integration circuit 446 in a manner that the integration circuit can track.

When the offset voltage readjustment time period has not expired (620), offset voltage generator 450 holds (622) the offset voltage approximately constant while non-offset control signal generator 440 repeatedly readjusts (612, 614) the non-offset control signal based on further samplings of output signal 413. That is, between discrete adjustments of the offset voltage, voltage generator 450 holds the offset voltage approximately constant while the non-offset control signal generator 440, in particular integration circuit 446, gradually ramps up an amplitude of the non-offset control signal. The approximately constant offset voltage is then combined (616) with the repeatedly readjusted non-offset control signal to produce a repeatedly readjusted control signal 470 that is sourced by control circuit 430 to gain and phase adjuster 424, which control signals are utilized by the gain and phase adjuster to repeatedly readjust (618) error signal 422.

When the predetermined time period has expired (620), offset voltage generator 440, preferably microprocessor 452, determines (624) if the offset voltage has been reduced to zero. If the offset voltage has not been reduced to zero (624), offset voltage generator 440 generates (626) a next offset voltage by the process described in greater detail above and logic flow diagram 600 returns to step 612. Feed forward amplifier 308 then repeats steps 612 through 624. If the offset voltage has been reduced to zero (624), then logic flow diagram 600 ends (628).

By providing a control signal 470 that includes an offset voltage that may be set to a predetermined value, feed forward amplifier 308 is able to converge the control signal to an optimal voltage much more quickly than feed forward amplifiers of the prior art, which may require as long as 30 seconds to move from a rail, or "start," position to the optimal, typically near mid-range, position. The offset voltage produced by offset voltage generator 450 is varied with time. By presetting the offset voltage to a value just below a best value when transmitter 306 turns on, the output of integration circuit 446, that is, the non-offset control signal, may be near zero. After each expiration of a subsequent time period, the offset voltage produced by offset voltage generator 450 may be reduced a small amount, forcing the integration circuit 446 to re-converge at a slightly higher value, that is, forcing the integration circuit to produce a non-offset control signal of a slightly higher voltage. Since each new convergence voltage of integration circuit 446 is only slightly higher that the preceding voltage, the convergence is quick and the amplified and adjusted error signal generated by feed forward correction circuit 418 is kept small. Preferably, this process of reducing the offset voltage and re-converging integration circuit 446, that is, the non-offset control signal, is repeated continually until the offset voltage is reduced to zero and the integration circuit is converged to a proper value. In this manner, control signal 470 may be kept at a nearly constant, optimal voltage, instead of being ramped up over time as in the prior art. Furthermore, by combining a digitally adjusted offset voltage with an analog non-offset control signal, control signal 470 may be adjusted by non-offset control signal generator 440 in a non-stepped fashion, allowing for fine adjustments of control signal 470 and of error signal 422, and thereby of output signal 413, upon a powering up of transmitter 306.

Figure 7A:
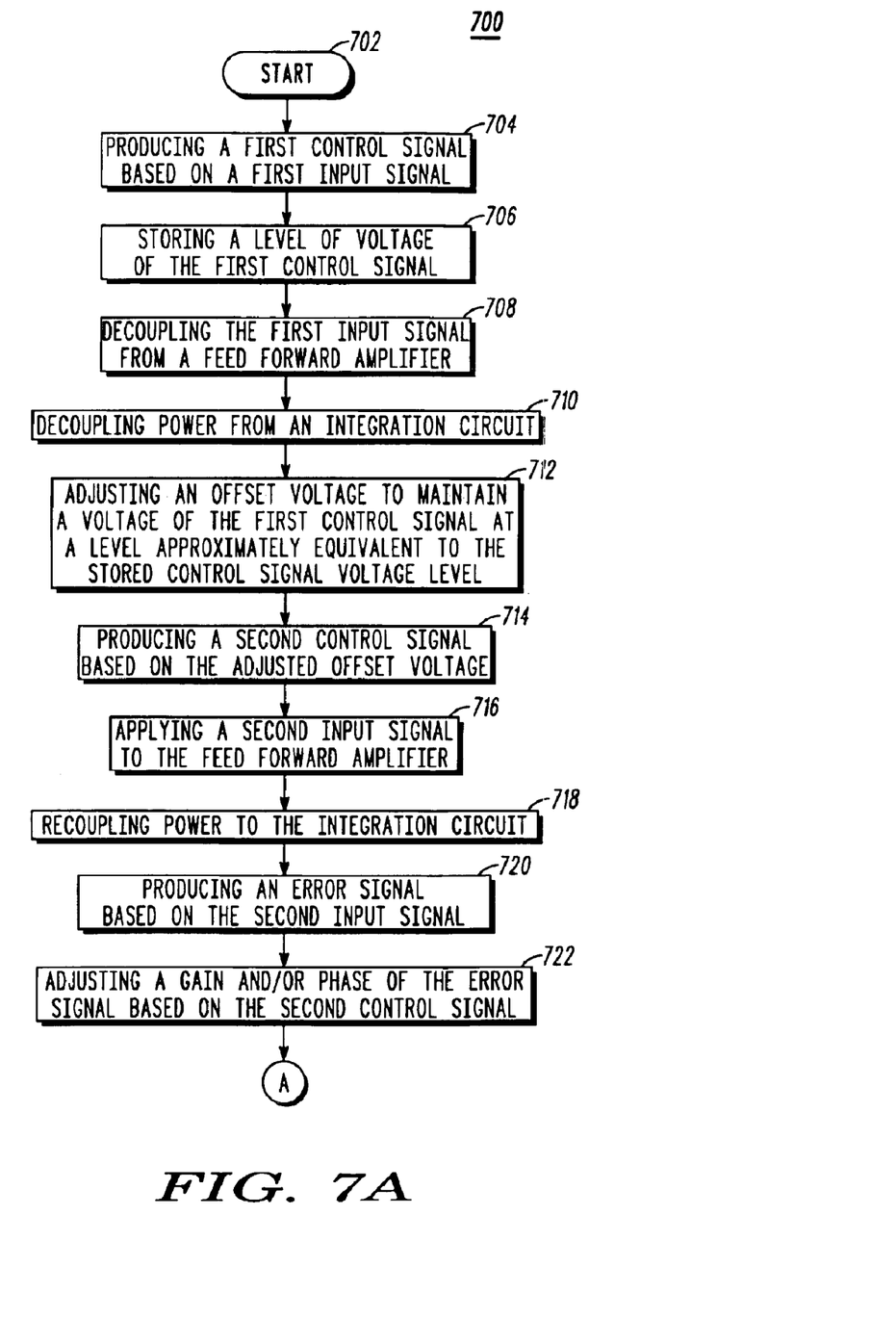
FIG. 7A is a logic flow diagram of steps executed by the feed forward amplifier of FIG. 4 in generating a control signal and adjusting an error signal in accordance with another embodiment of the present invention.
Figure 7B:
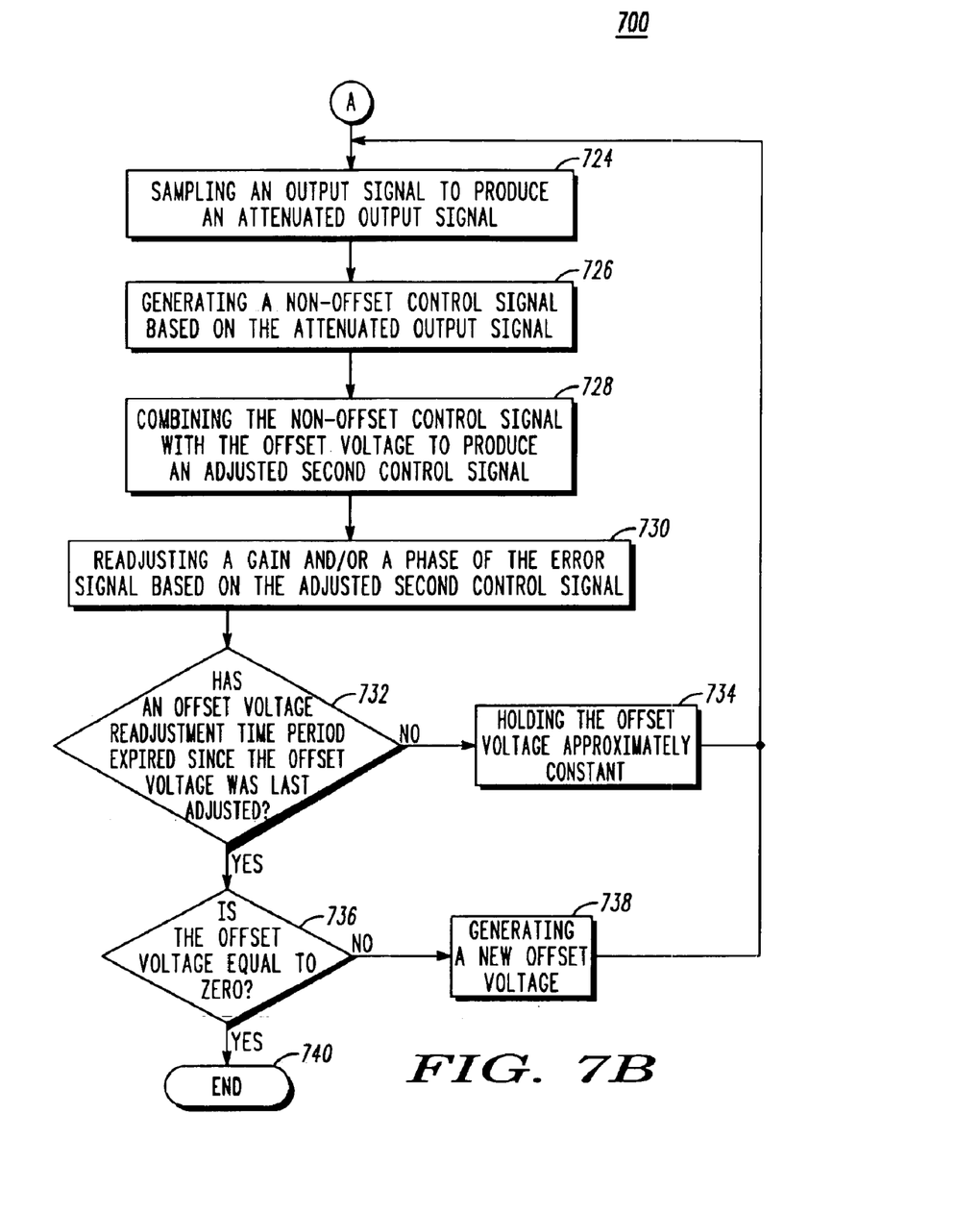
FIG. 7B is a continuation of the logic flow diagram of FIG. 7A depicting steps executed by the feed forward amplifier of FIG. 4 in generating a control signal and adjusting an error signal in accordance with another embodiment of the present invention.

In another embodiment of the present invention, feed forward amplifier 308 may pause an operation of integration circuit 446 for a period of time corresponding to a decoupling of input signal 402 from the feed forward amplifier and a subsequent application of a same or a different input signal 402 to the feed forward amplifier. FIGS. 7A and 7B depict a logic flow diagram 700 of steps executed by feed forward amplifier 308 in generating a control signal and adjusting an error signal in accordance with another embodiment of the present invention. Logic flow 700 begins (702) when feed forward amplifier 308 produces (704) a first control signal, such as control signal 470, based on a first input signal 402 and stores (706), in one or more memory devices 454, a level of a voltage of the control signal, that is, a voltage output by adder 432. Preferably, feed forward amplifier 308 produces the first control signal as is described above with respect to logic flow diagram 600. Communication device 300 decouples (708) the first input signal 402 from feed forward amplifier 308 and further decouples (710) power from integration circuit 446. For example, a switch (not shown) included in communication device 300 may decouple a power supply (not shown) included in the communication device from the integration circuit.

In response to the decoupling of input signal 402 from feed forward amplifier 308, offset voltage generator 450 adjusts (712) an offset voltage generated by the offset voltage generator in order to maintain a voltage of control signal 470 at a level approximately equivalent to the stored control signal voltage level. Preferably, offset voltage generator 450 adjusts a voltage of D/A 458 to maintain an output of adder 432 at the stored voltage level. For example, microprocessor 452 may, by reference to a lookup table stored in one or more memory devices 454 and based on the stored voltage level, source a value to D/A 458 that will maintain the voltage of control signal 470 at the stored voltage level. By way of another example, a voltage waveform pattern may be stored in one or more memory devices 454. Microprocessor 452 may, by reference to the voltage waveform pattern and based on the stored voltage level, source a value to D/A 458 that will maintain the voltage of control signal 470 at the stored voltage level. Based on the adjusted offset voltage generated by offset voltage generator 450, control circuit 430 produces (714) a second control signal 472 that is sourced to gain and phase adjuster 424, which second control signal may the same as, or an adjusted version of, the first control signal 470.

Subsequent to the decoupling of input signal 402 from feed forward amplifier 308, communication device 300 applies (716) a second input signal 403 to the feed forward amplifier and re-couples (718) power to integration circuit 446. Feed forward amplifier 308 produces (720) an error signal 423 based on the second input signal 403, as is described in detail above, and gain and phase adjuster 424 adjusts (722) a gain and/or a phase of error signal 423 based on the second control signal 472 that is, in turn, based on the stored voltage level. Feed forward amplifier then executes, in steps 724 through 740, functions similar to the steps 612 through 628 described above with respect to logic flow diagram 600. That is, output signal coupler 414 receives an output signal 413 and samples (724) the output signal to produce an attenuated output signal. Signal coupler 414 conveys the attenuated output signal to control circuit 430, and in particular to non-offset control signal generator 440. Based on the attenuated output signal, non-offset control signal generator 440 generates (726) a non-offset, or unadjusted, control signal that the non-offset control signal generator sources to adder 432.

Adder 432 combines (728) the non-offset, or unadjusted, control signal with the offset voltage sourced to the adder by offset voltage generator 450 to produce an adjusted second control signal, which adjusted second control signal is an offset, or adjusted, version of the non-offset control signal sourced by non-offset control signal generator 440. The adjusted second control signal is then conveyed by adder 432 to gain and phase adjuster 424, and gain and phase adjuster 424 adjusts (730) a gain and/or phase of error signal 423 based on the adjusted second control signal, thereby adjusting the error signal based on distortion components detected in output signal 413 and reducing an energy of the distortion components of output signal 321.

When the offset voltage readjustment time period has not expired (732), offset voltage generator 440 holds (734) the offset voltage approximately constant while non-offset control signal generator 440 repeatedly readjusts (724, 726) the non-offset control signal based on further samplings of output signal 413. The approximately constant offset voltage is combined (728) with the repeatedly readjusted non-offset control signal to produce a repeatedly readjusted control signal 470 that is sourced by control circuit 430 to gain and phase adjuster 424, which control signals are utilized by the gain and phase adjuster to repeatedly readjust (730) error signal 422.

When the predetermined time period has expired (732), offset voltage generator 450, preferably microprocessor 452, determines (736) if the offset voltage has been reduced to zero. If the offset voltage has not been reduced to zero (736), offset voltage generator 450 generates (738) a next offset voltage by the process described in greater detail above and logic flow diagram 700 returns to step 724. Feed forward amplifier 308 then repeats steps 724 through 736. If the offset voltage has been reduced to zero (736), then logic flow diagram 600 ends (740).

By providing for a voltage level of a control signal to be maintained while an input signal is decoupled from the transmitter, and then a control signal, at the maintained voltage level, to be reapplied to feed forward amplifier 308 when an input signal is subsequently coupled to the feed forward amplifier, feed forward amplifier 308 provides a control circuit whose operation may be paused and then resumed without the need to restart the control process. This is similar to the convergence process described with respect to FIG. 6, except that the starting, post-pause offset voltage of offset voltage generator 450 is modified to be the last known value of the control signal 470. Such pausing reduces a need for control circuit 430 to again ramp up a control signal after signals have been decoupled and then re-coupled to feed forward amplifier 308, allowing for a reduction in the convergence time of integration circuit 446 over the integration circuits of the prior art.

While the present invention has been particularly shown and described with reference to particular embodiments thereof, it will be understood by those skilled in the art that various changes may be made and equivalents substituted for elements thereof without departing from the scope of the invention as set forth in the claims below. Accordingly, the specification and figures are to be regarded in an illustrative rather then a restrictive sense, and all such changes and substitutions are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any variation thereof, are intended to cover a non-exclusive inclusion, such that a process, method, article, or apparatus that comprises a list of elements does not include only those elements but may include other elements not expressly listed or inherent to such process, method, article, or apparatus. It is further understood that the use of relational terms, if any, such as first and, second, top and bottom, and the like are used solely to distinguish one entity or action from another entity or action without necessarily requiring or implying any actual such relationship or order between such entities or actions.

What is claimed is:

1. A method for correcting distortion in a feed forward amplifier comprising:
   determining an error signal based on an input signal and an amplified version of the input signal;
   sampling an output signal to produce an attenuated output signal;
   generating a non-offset control signal based on the attenuated output signal;
   generating an offset voltage that is designed to achieve a non-zero direct current (DC) offset in a control signal;
   combining the non-offset control signal with the offset voltage to produce a non-zero DC offset control signal; and
   adjusting the error signal based on the control signal to produce an adjusted error signal that is capable of reducing distortion in the feed forward amplifier.

2. The method of claim 1, wherein generating a non-offset control signal comprises:
   detecting a power of the attenuated output signal to produce a detected signal;
   correlating the detected signal with a reference signal to produce a correlated signal; and
   integrating the correlated signal to produce a non-offset control signal.

3. The method of claim 1, wherein generating an offset voltage comprises determining an offset voltage by reference to stored offset voltages.

4. The method of claim 1, wherein generating an offset voltage comprises:
   sampling the non-offset control signal to produce a sampled non-offset control signal; and
   generating an offset voltage based on the sampled non-offset control signal.

5. The method of claim 1, wherein the attenuated output signal, the non-offset control voltage, and the control signal respectively comprise a first attenuated output signal, a first non-offset control voltage, and a first control signal, and wherein the method further comprises:
   sampling the output signal to produce a second attenuated output signal;
   generating a second non-offset control signal based on the second attenuated output signal;
   combining the second non-offset control signal with the offset voltage to produce a second control signal; and
   readjusting the error sigal based on the second control signal.

6. The method of claim 1, wherein the attenuated output signal, to non-offset control voltage, the offset voltage, and the control signal respectively comprise a first attenuated output signal, a first non-offset control voltage, a first offset voltage, and a first control signal, and wherein the method further comprises:
   determining whether a time period has expired;
   when the time period has expired:
      sampling the output signal to produce a second attenuated output signal;
      generating a second non-offset control signal based on the second attenuated output signal;
      generating a second offset voltage that is designed to achieve a non-zero direct current (DC) offset in a control signal;
      combining the second non-offset control signal with the second offset voltage to produce a second non-zero DC offset control signal; and readjusting the error signal based on the second control signal.

7. The method of claim 1, wherein the attenuated output signal, the non-offset control voltage, the offset voltage, and the control signal respectively comprise a first attenuated output signal, a first non-offset control voltage, a first offset voltage, and a first control signal, and wherein the method further comprises:

determining whether a time period has expired;

determining whether the offset voltage is approximately equal to zero;

when the time period has expired and the offset voltage is not approximately equal to zero:

sampling the output signal to produce a second attenuated output signal;

generating a second non-offset control signal based on the second attenuated output signal;

generating a second offset voltage that is designed to achieve a non-zero direct current (DC) set in a control signal;

combining the second non-offset control signal with the second offset voltage to produce a second non-zero DC offset control signal; and readjusting the error signal based on the second control signal.

8. The method of claim 1, wherein the input signal comprises a first input signal and the control signal comprises a first control signal and wherein the method further comprises steps of:

storing a level of a voltage of the first control signal;

decoupling the first input signal from the feed forward amplifier;

adjusting the offset voltage to maintain a voltage of the first control signal at a level approximately equivalent to the stored control voltage level;

in response to the decoupling of the first input signal, producing a second control signal based on the adjusted offset voltage;

receiving a second input signal;

producing a second error signal based on the second input signal; and adjusting a gain or a phase of the second error signal based on the second control signal.

9. An apparatus for correcting distortion in a feed forward amplifier, the apparatus comprising a control circuit that receives an attenuated version of an output signal, generates a non-offset control signal based on the attenuated output signal, generates an offset voltage, which offset voltage is designed to achieve a non-zero direct current (DC) offset in a control signal, combines the non-offset control signal with the offset voltage to produce a nonzero DC offset control signal, and wherein the control signal is capable of causing an adjustment of an error signal to produce an adjusted error signal that is capable of reducing distortion in the feed forward amplifier.

10. The apparatus of claim 9, wherein the control circuit comprises a non-offset control signal generator that generates the non-offset control signal by detecting a power of the attenuated output signal to produce a detected signal, correlating the detected signal with a reference signal to produce a correlated signal, and integrating the correlated signal to produce a non-offset control signal.

11. The apparatus of claim 9, wherein the control circuit comprises an offset voltage generator that generates the offset voltage based on stored offset voltages.

12. The apparatus of claim 9, wherein the control circuit comprises an offset voltage generator that generates an offset voltage that is designed to achieve a non-zero direct current (DC) offset in a control signal by sampling the non-offset control signal to produce a sampled non-offset control signal and generating an offset voltage based on the sampled non-offset control signal.

13. The apparatus of claim 9, wherein the attenuated output signal the non-offset control voltage, and the control signal respectively comprise a first attenuated output signal, a first non-offset control voltage, and a first control signal, and wherein the control circuit further samples the output signal to produce a second attenuated output signal, generates a second non-offset control signal based on the second attenuated output signal, combines the second non-offset control signal with the offset voltage to produce a second control signal, and wherein the second control signal is capable of causing a readjustment of the error signal.

14. The apparatus of claim 9, wherein the attenuated output signal, the non-offset control voltage, the offset voltage, and the control signal respectively comprise a first attenuated output signal, a first non-offset control voltage, a first offset voltage, and a first control signal, and wherein the control circuit further determines whether a time period has expired and, when the time period has expired, samples the output signal to produce a second attenuated output signal, generates a second non-offset control signal based on the second attenuated output signal, generates a second offset voltage that is designed to achieve a non-zero direct current (DC) offset in a control signal, combines the second non-offset control signal with the second offset voltage to produce a second non-zero DC offset control signal, and wherein the second control signal is capable of causing a readjustment of the error signal.

15. The apparatus of claim 9, wherein the attenuated output signal, the non-offset control voltage, the offset voltage, and the control signal respectively comprise a first attenuated output signal, a first non-offset control voltage, a first offset voltage, and a first control signal, and wherein the control circuit further determines whether a time period has expired, determines whether the offset voltage is approximately equal to zero, and, when the time period has expired and the offset voltage is not approximately equal to zero, samples the output signal to produce a second attenuated output signal, generates a second non-offset control signal based on the second attenuated output signal, generates a second offset voltage that is designed to achieve a non-zero direct current (DC) offset in a control signal, combines the second non-offset control signal with the second offset voltage to produce a second non-zero DC offset control signal, and wherein the second control signal is capable of causing a readjustment of the error signal.

16. The apparatus of claim 9, wherein the output signal is based on a first input signal, wherein the control signal comprises a first control sigal, wherein the error signal comprises a first error signal, wherein the apparatus further comprises a feed forward correction circuit that determines the first error signal based on the first input signal and an amplified version of the first input signal and adjusts th first error signal based on the first control signal, wherein the control circuit further stores a level of a voltage of the first control signal, adjusts the offset voltage to maintain a voltage of the first control signal at a level approximately equivalent to the stored control voltage level, in response to a decoupling of the first input signal produces a second control signal based on the adjusted offset voltage, and wherein the feed forward correction circuit further produces a second error signal based on a second input signal and adjusts a gain or a phase of the second error signal based on the second control signal.

17. A communication device having a transmitter that comprises:

a main signal path that receives an input signal, amplifies the input signal to produce an amplified signal, and produces an output signal based on the amplified signal and an adjusted error signal;

a feed forward correction circuit coupled to the main signal path that produces an error signal based on the input signal and the amplified signal;

a control circuit coupled to the main signal path and to the feed forward correction circuit that receives a sampled version of the output signal, generates a non-offset control signal based on the sampled version of the output signal, generates an offset voltage that is designed to achieve a non-zero direct current (DC) offset in a control signal, and combines the non-offset control signal with the offset voltage to produce a non-zero DC offset control signal; and wherein the feed forward correction circuit adjusts the error signal based on the control signal to produce the adjusted error signal.

18. The communication device of claim 17, wherein the control circuit comprises an offset voltage generator that generates the offset voltage based on the stored offset voltages.

19. The communication device of claim 17, wherein the attenuated output signal, the non-offset control voltage, the offset voltage, and the control signal respectively comprise a first attenuated output signal, a non-offset control voltage, a first offset voltage, and a first control signal, and wherein the control circuit further determines weather a time period has expired and, when the time period has expired, samples the output signal to produce a second attenuated output signal, generates a second non-offset cool signal based on the second attenuated output signal, generates a second offset voltage that is designed to achieve a non-zero direct current (DC) offset in a control signal, combines the second non-offset control signal with the second offset voltage to produce a second non-zero DC offset control signal, and wherein the feed forward correction circuit readjusts the error signal based on the second control signal.

20. The communication device of claim 17, wherein the output signal is based on a first input signal, wherein the control signal comprises a first control signal, wherein the error signal comprises a first error signal, wherein the feed forward correction circuit wherein the control circuit further stores a level of a voltage of the first control signal, adjusts the offset voltage to maintain a voltage of the first control signal at a level approximately equivalent to the stored control voltage level, in response to a decoupling of the first input signal produces a second control signal based on the adjusted offset voltage, wherein the main signal path receives a second input sigal and amplifies the second input signal to produce a second amplified signal, and wherein the feed forward correction circuit further produces a second error signal based on the second input signal and the second amplified signal and adjusts a gain or a phase of the second error signal based on the second control signal.

* * * * *